United States Patent [19]

Sauer et al.

[11] Patent Number: 4,458,445
[45] Date of Patent: Jul. 10, 1984

[54] SLIDING ELECTRICALLY MOVED WINDOW PROVIDED WITH A SAFETY DETECTOR

[75] Inventors: Gerd Sauer, Stolberg-Venwegen; Dieter Unbehaun, Nuremberg, both of Fed. Rep. of Germany

[73] Assignee: Saint-Gobain Vitrage, Courbevoie, France

[21] Appl. No.: 361,414

[22] Filed: Mar. 24, 1982

[30] Foreign Application Priority Data

Mar. 25, 1981 [DE] Fed. Rep. of Germany ....... 3111696

[51] Int. Cl.$^3$ ............................................. E05F 15/02
[52] U.S. Cl. ..................................................... 49/26
[58] Field of Search .................. 49/26, 28, 27, 31; 318/266, 286, 466

[56] References Cited

U.S. PATENT DOCUMENTS 3,651,389  3/1972  Ito et al. ............................... 318/266
4,351,016  9/1982  Felbinger ............................. 49/28 X

FOREIGN PATENT DOCUMENTS 1690298   5/1967  Fed. Rep. of Germany .
2939942   4/1981  Fed. Rep. of Germany .
2073975  10/1971  France .

*Primary Examiner*—Philip C. Kannan
*Attorney, Agent, or Firm*—Pennie & Edmonds

[57] ABSTRACT

Apparatus for an electrically moved sliding window, used illustratively in automotive applications, having first a built-in safety device, for providing a signal whenever the window has been raised or lowered to a preselected height and second a proximity detector is described. The proximity detector comprises a conductive strip constituting a capacitive pickup running along on a surface of the window and its upper edge. The pickup is connected to a control circuit by a conductive line which runs vertically along a side edge of the window and, more particularly, positioned at a predetermined distance inward from the side edge of the window. A plurality of vertical conducting lines, used for switching and height sensing purposes, runs vertically on the surface of the window and, more particularly, in the space between the side edge and the conductor which runs to the pickup.

6 Claims, 8 Drawing Figures

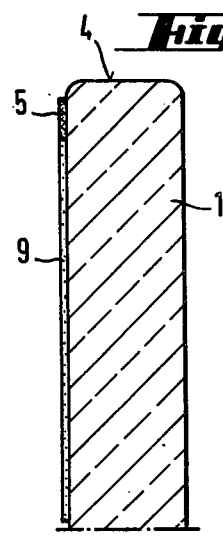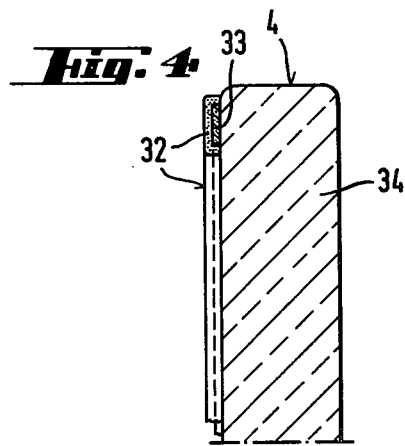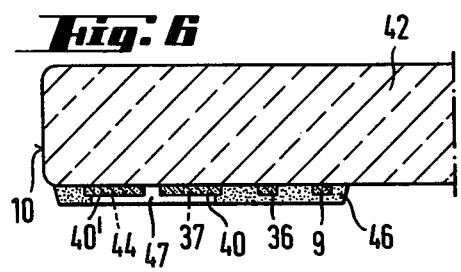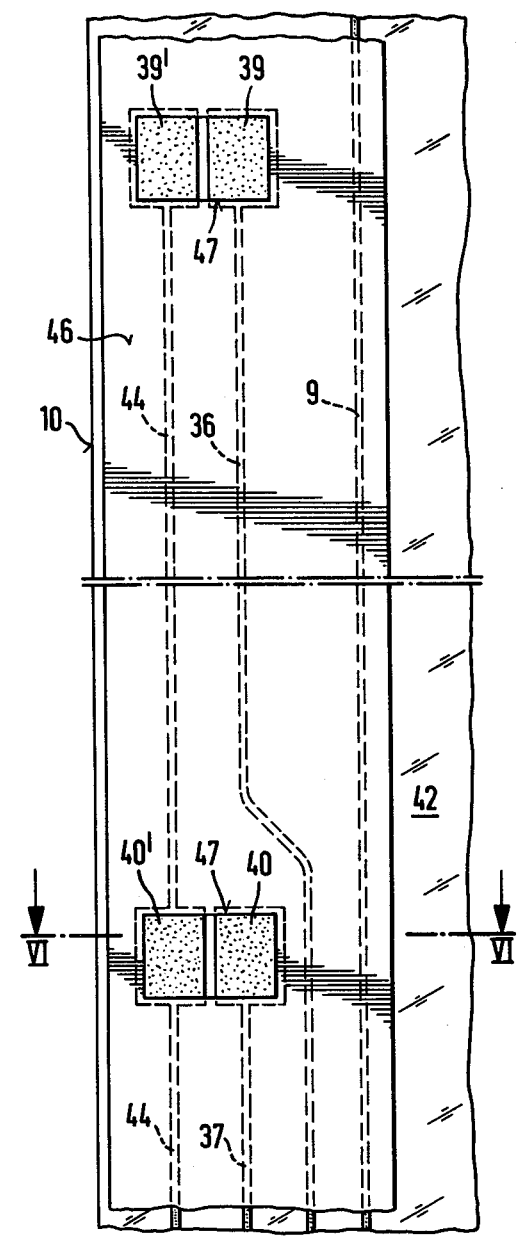

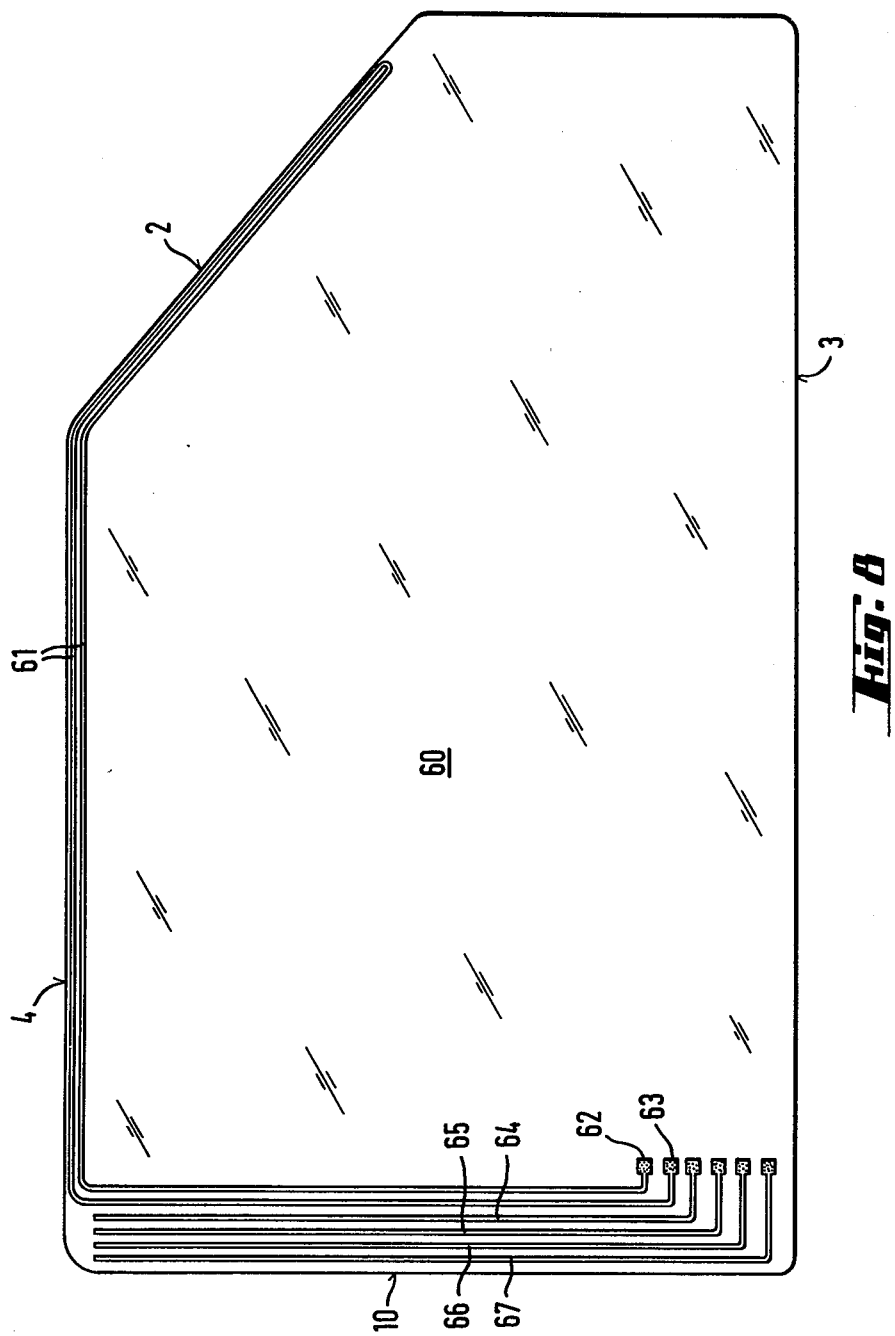

SLIDING ELECTRICALLY MOVED WINDOW PROVIDED WITH A SAFETY DETECTOR

BACKGROUND OF THE INVENTION

1. Field of the Invention

The invention relates to a sliding window and, more particularly, to one which is adapted for use in automobiles and is raised and lowered electrically, and is equipped with a safety device and a height detector.

2 Description of the Prior Art

Sliding windows used, illustratively in automobiles and equipped with safety devices, have been described in U.S. Pat. No. 3,651,389 and in German Pat. application No. P 29 39 942. As described therein, a capacitive pickup comprising a conductive strip is placed on the surface of the window and runs along its upper edge. Connected to this pickup is a conductive connecting line which is oriented along a vertical or oblique edge of the window to a point where a connection is made to a cable which connects the pickup to an electronic proximity detecting circuit.

Proximity safety devices of this sort should respond even if the pickup does not come in direct conductive contact with a part of a human's body. This occurs, for example, when the edge of the glass is touched with, for example, a gloved hand. In order for the safety device to respond under this condition, the proximity detector should have a very high sensitivity, i.e., a very high gain. However, if the detector is set to such a gain, adverse affects, such as circuit instabilities and spurious signals, which are unrelated to the approach of a part of the body, will cause the detector to produce an erroneous indication. In addition, windows having safety devices of this sort cannot be mass produced by known standard processes.

SUMMARY OF THE INVENTION

Accordingly, it is an object of this invention to provide an arrangement for a safety detector for a vehicular sliding window which will not produce an erroneous indication of the approach of the part of the human's body.

It is another object of this invention to provide an arrangement for a safety device for a vehicular sliding window which is insensitive to spurious influences or signals.

It is another object of this invention to provide an arrangement for a vehicular sliding window equipped with a safety device which can be easily mass produced using well known processes.

These and other objects are achieved in accordance with the present invention by placing an electrically conductive strip, on the inside face of the window glass, which runs along the upper edge of the eindow and which acts as a capacitive pickup. This strip is positioned near the upper edge of the window. This strip is connected by a vertically oriented connection line which runs along the vertical side edge of the window and is spaced at a predetermined distance inward from that edge. This distance is made sufficiently large to reduce any disturbing influence of the window frame on the signals carried by the connection line.

Specifically, offsetting the vertical connecting line toward the center of the window significantly reduces the generation of spurious signals and thereby compensates for the necessary increase in sensitivity of the proximity detector. This is so because spurious signals are in geat measure, generated by the capacitance associated with the vertical connecting line running to the pickup. By moving this connection line inward from the edge, this capacitance is significantly reduced. For this reason, the amplitude of the spurious signals can be advantageously and significantly reduced to such a level that the control unit will not produce any erroneous indications.

In accordance with an aspect of this invention, additional conducting lines are placed in the zone or area between the connecting line, running from the capacitive pickup, and the edge of the window. These lines contain contacts which are used to provide information, regarding the height of the window, to an electronic control circuit. When the window reachs either a fully opened or a fully closed position, the control circuit signals a power stage to remove the power applied to the motor, which moves the window. This thereby prevents the window from moving past either of these end points. In addition, various contacts are provided on these connection lines at points intermediate these end points, and in particular, near the lower edge of the window. When the window is nearly completely drawn into the window frame, these contacts cause the detector to modify its sensitivity in order to eliminate or at least reduce any improper response caused whenever the pickup approaches the metal frame.

In accordance with another aspect of the invention, the window is advantageously able to carry additional or auxiliary conductive lines or areas which are intended for other varied uses. These conductive lines are made of the same material as the pickup and are made at the same time as the pickup. These auxiliary lines and areas can illustratively be used to make a heating element, a power supply network, a moisture dectector, an antenna, or soldering connections.

BRIF DESCRIPTION OF THE DRAWING

The invention may be clearly understoood from a consideration of the following detailed description and accompanying drawing in which:

FIG. 3 is a sectional view taken along line III—III and in the direction of the arrows, both shown in FIG. 1;

Figure 7:
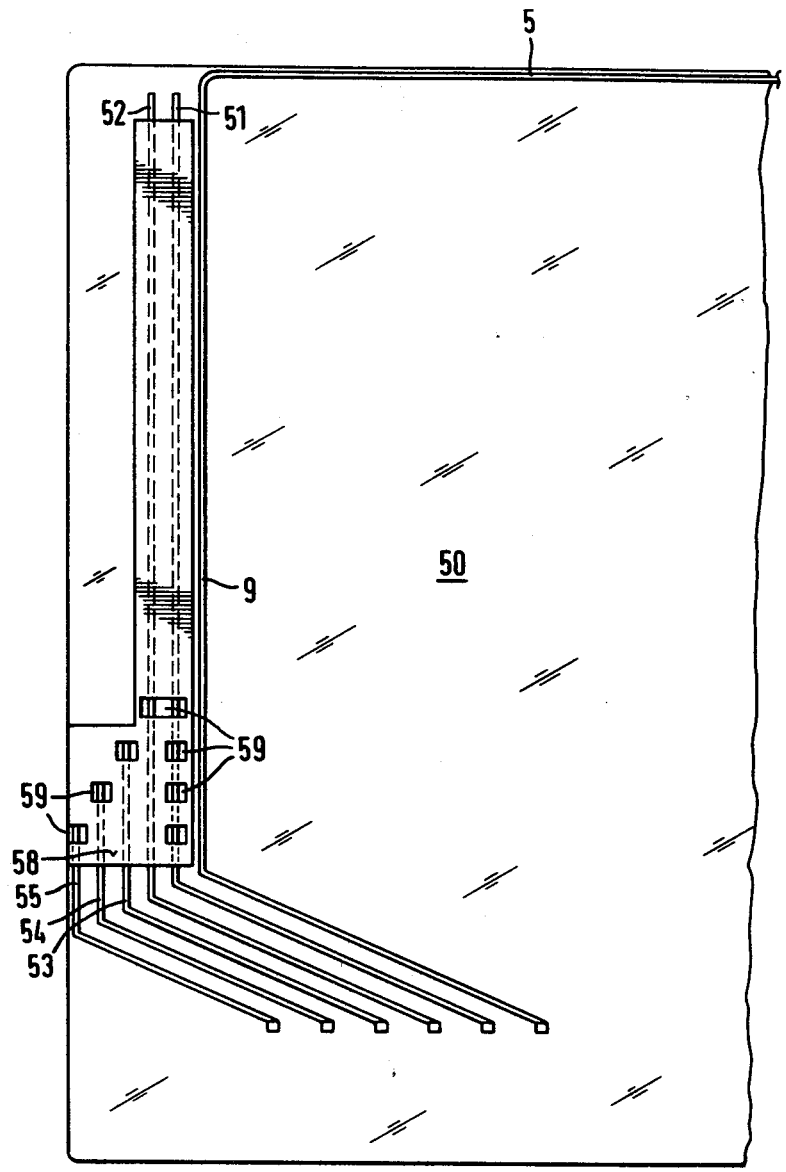

FIG. 4 is a sectional view similar to that shown in FIG. 3 which, more particularly, shows a protective layer 32 covering conductive line 9 and contact area 33, both shown in FIG. 3;

FIG. 5 is a detail view of the left side of another embodiment of a vehicular window which embodies the principles of the present invention;

FIG. 6 is a sectional view taken along line IV—IV and in the direction of the arrows, both shown in FIG. 5;

FIG. 7 depicts another embodiment of a vehicular window which embodies the principles of the present invention and is, more particularly, provided with conductive lines covered with a protective layer 58; and FIG. 8 depicts a further embodiment of a vehicular window according to the principles of the present in-

DETAILED DESCRIPTION

The glass shown in all the figures is illustratively used for the sliding window of an automobile door. A window of this type can take on many different shapes, but as a general rule, it resembles glass 1, shown in FIG. 1. This window is generally rectangular with a curved shape 2 corresponding to the shape of the window opening. Lower edge 3 is held in a metal shape (not shown) on which a drive motor (also not shown), acting through a suitable lever or transmission, raises and lowers the window glass.

An electrical conductor deposited in the form of a conductive strip approximately 0.4 to 1.0 mm wide and approximately 0.01 to 0.02 mm thick, constitutes pickup 5. This conductor is placed on the inside surface of the window, i.e., that surface which faces the inside of the automobile, and is, more particularly, positioned along horizontal upper edge 4 and oblique edge 2.

As shown in FIG. 3, pickup 5 is placed in the immediate vicinity of the top edge, and, more particularly, 1 to 5 mm below it. The pickup is preferably constructed as a printed strip, normally consisting of a conductive ceramic or enamel with a metal silver base. Such materials find common use in commercial silkscreening, and are currently used in making automotive heating glass. The strip is applied to the window using well known silkscreen techniques and fired at a temperature of approximately 600° C., preferably during the heat treatment which is used to temper the window glass.

The electronic control circuit, which controls the height of the window and contains the proximity detector is located inside the door frame, for example, in the vicinity of the drive motor or, is preferably, placed directly on the window glass in the vicinity of its lower edge. For further information regarding the placement of this circuit, the reader is referred to patent application, Ser. No. 362,038, filed Mar. 25, 1982 (now U.S. Pat. No. 4,410,843) entitled "Electrically Controlled Sliding Window and Proximity Detector," which is incorporated herein by reference. Pickup 5 is electrically connected, via conductive line 9, to the control circuit by enlarged contact area 8. This contactarea is comprised of the same material as pickup 5 and is manufactured in the same manner.

Line 9 is positioned at a predetermined distance A, which is approximately 2 cm or more, from the more orless vertical edge 10 of window glass 1. The distance thus established between vertical conductor 9 and the metal window frame guarantees that substantially no spurious signals occur as the result of the increased capacitive coupling between this vertical conductor and the metal window frame as the window is being closed.

Two conductive lines 12 and 13 are placed in the area or zone of the window glass delimited by edge 10 and conducting line 9. Conducting lines 12 and 13 each have a contact area 14 or 15, respectively, at one end and a connection area 16 or 17, respectively, at the other end. A sliding contact placed in the window frame electrically contacts each of these contact areas and is used to signal the control circuit to cut-off the power to the drive motor in the end-of-travel positions of the window, i.e., fully opened or fully closed.

Figure 1:
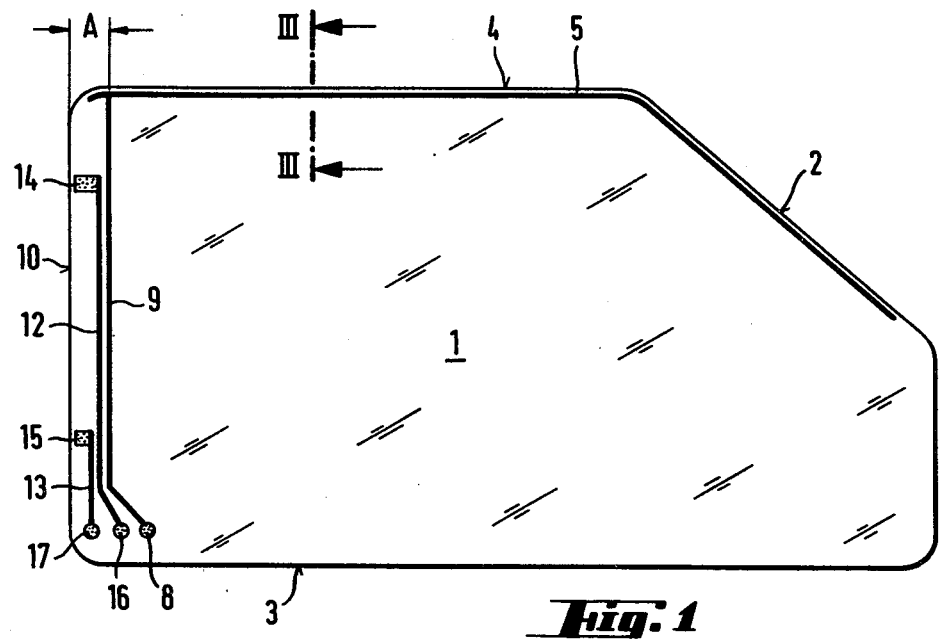
FIG. 1 is an overall view of the simplest form of a vehicular window which embodies the principles of the present invention.
Figure 2:
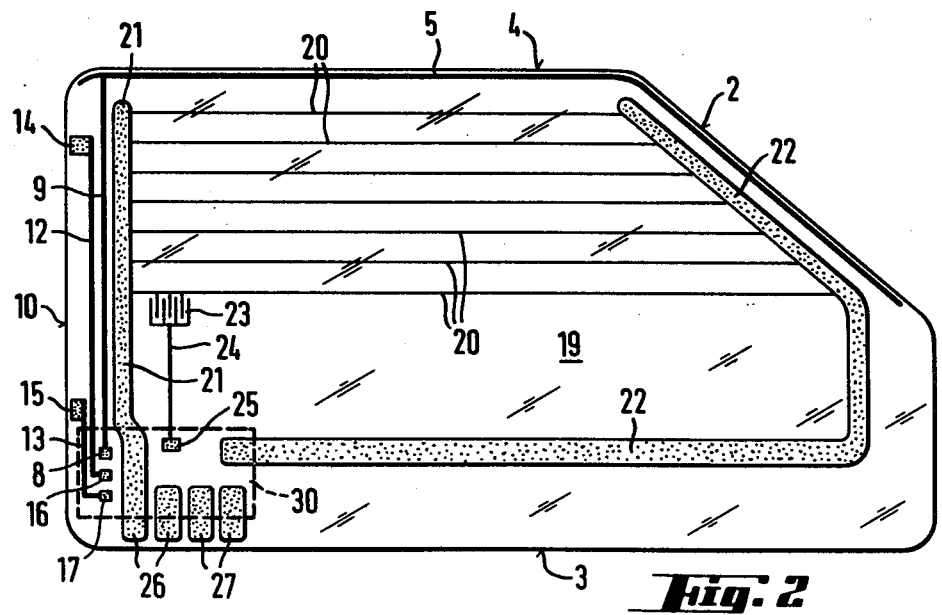
FIG. 2 depicts a vehicular window which embodies the principles of the present invention and is provided with a heating element having a moisture pickup and connection area.

Glass 19, shown in FIG. 2, exhibits the same arrangement of conductors as that shown in FIG. 1 but also includes electric heating conductors 20 connected at their ends to lateral collectors 21 and 22. The surface of this window also carries a moisture detector 23 which is connected by a conductive line 24 to a connection area 25. As shown in FIG. 2, the electronic control circuit is made of a compact element, represented by broken lines, which is preferably a single-piece intergrated circuit 30 fastened directly, by, for example, a layer of glue applied directly to the glass surface. Other connection areas 26 and 27 are also placed on the glass surface. Connection areas 26 are used to connect a source of power, illustratively that provided by the vehicle's battery, to the control circuit. Connection areas 27 connect the drive signal produced by the control circuit to the power stage (not shown) which is, in turn, connected to the motor.

At the time of manufacture, all the conductive strips and contact areas are deposited on the window glass at the same time as pickup 5 and are comprised of the same ceramic or enamel material. Conductive lines 9 and 24, and, if necessary, lines 12 and 13, are arranged in a stationary arrangement among themselves and in relation to the control circuit. By so doing, this arrangement not only simplifies all the connections to the control circuit, but also, significantly eliminates the risks of spurious signals.

In manu cases, it is desirable to cover all or part of the conductive strips on the window glass with an insulating layer to protect them from moisture and/or physical wear. This coating is readily applied by depositing an insulating composition, illustratively a ceramic composition, over all the conductive strips, after they have been printed onto the window and have dried. Thereafter, both the conductors and the insulating layers are fired at the same time. Specifically, FIG. 4 depicts protective layer 32 deposited on conductor 33 which is carried on the inside face of a glass 34. In order that the respective qualities of the conductive strips and insulating layer are not adversely affected when both of these layers come into mutual contact, it is necessary to use compatible ceramic compositions for both of these layers. Compositions of this sort are readily available as pastes, which can be applied to the window glass by conventional silkscreen processes well known in the art.

As previously discussed, additional conducting lines running to the control circuit can be placed in the zone or area consisting between connecting line 9 and edge 10. Contact areas existing at preselected positions are located on these lines. As the window is raised or lowered, these contact areas are successively short-circuited together by a conductive post or stud mounted in the window frame. As a result, as the window glass is lowered into the window frame, the sensitivity of the detecting circuit contained within the control circuit is changed, depending upon which paticular contact areas are short-circuited. Arrangements of these sorts are shown in FIGS. 5 through 8. For further information regarding the change in sensitivity of the detecting circuit, the reader is referred to our co-pending U.S. patent application entitled "Electronic Safety Device for Conntrolling the Drive Motor Attached to a Sliding Window," Ser. No. 362,040, filed Mar. 25, 1982 which is incorporated herein by reference.

As shown in FIGS. 5 and 6, two switching lines 36 and 37, ending at respective contact areas 39 and 40, are placed between edge 10 of glass 42 and connecting line 9. Contact areas 39' and 40', which are both connected to the same power supply line 44 are positioned adjacent to contact areas 39 and 40. A sliding contact or stud placed at a fixed site in the window frame is used to connect either contact pair 39 and 39' or 40 and 40' together, depending upon the height of the window. As the window closes, the gain of the detecting circuit is changed depending upon which pair is shorted together. All these conductive lines are covered with an electrically insulating protective layer 46 consisting of an insulating ceramic or enamel material. Protective layer 46 is deposited by illustratively using well known silkscreening techniques. This layer is silkscreened onto the conductive lines after the latter has been silkscreened onto the window glass and has dried. The conductive lines and the protective layers are simultaneously fired during the heat treatment used to temper the glass sheet. Contact area 39, 39', 40 and 40' are not covered with the protective layer, and are, more particularly, positioned at an appropriate distance away from the metal frame such that only the sliding conductive contact or stud makes electrical contact with these areas.

In the embodiment shown in FIG. 7, glass 50 carries, on the left side of connecting line 9, a group of five switching lines 51 to 55, all of which are protected by the same insulating layer 58. Windows 59 are made at various heights in protective layer 58 to expose the conducting lines at preselected locations so that a sliding conductive contact or stud located in the window frame successively connects lines 52, 53, 54 and 55 to line 51. Conducting line 51 is used to signal a control circuit that the window is fully opened and, as such, has reached one end of its permissible travel. As the window is closed, conducting line 53 and 54 successively contact line 55 and cause the control circuit to change the sensitivity of the detecting circuit.

As shown in the embodiment depicted in FIG. 8, a closed loop comprised of two series connected conduction lines can advantageously be used to implement pickup 61. The loop is deposited on glass 60, and has a double bend. This loop ends at connection areas 62 and 63 which are in turn connected to the control circuit and, more particularly, to the detector. Through this arrangement, the detector can easily determine whether the pickup is active over its entire length by, for example, merely applying a current to one end of the loop and detecting its presence at the other. Additionally, the loop can be simultaneously used in an alarm system. Specifically, whenever the window is broken, a simultaneous break occurs in the loop, and, as such, it can be used to signal the control circuit to triger a horn or siren, for example.

As shown in FIG. 8, four switching lines 64, 65, 66 and 67 are placed in the area between edge 10 and conductive strip 63 to perform the previously discussed function associated with controlling the raising and/or lowering of the window. All the conducting lines and loop 61 are advantageously covered with the protective layer of the type previously described (not shown).

Thus, many and varied arrangements incorporating the teachings of the present invention may be devised by those skilled in the art without departing from the spirit and scope of the invention.

What is claimed is:

1. An electrically operated sliding window equipped with a safety device, said safety device comprising:
   a capacitive pickup, running along an upper edge of said window, in the form of at least one conductive strip placed on a surface of the window and spaced inwardly from said upper edge by a predetermined distance, and
   a substantially vertical connection line running on a surface of said window, between one end of said conductive strip and a control crcuit, and positioned inwardly from a side edge of said window by a predetermined distance,
   whereby the generation of any spurious signals by said pickup is substantially reduced thereby significantly decreasing the likelihood that said safety device will produce any erroneous indications.

2. The invention in claim 1 in which said sliding window further comprises a plurality of conducting lines that run vertically in an area bounded by said side edge and said connection line.

3. The invention in claims 2 or 1 in which said pickup has the shape of a double-bend closed loop.

4. The invention in claim 3 wherein said conductive strip, said connection line and said conducting lines are made of the same material.

5. The invention in claim 4 wherein said conductive strip, said connection line and said conducting lines are covered with an insulating protective layer.

6. The invention in claim 5 wherein said control circuit comprises a compact element mounted directly on the surface of the window.

* * * * *